(12) United States Patent
Sadasivam et al.

(10) Patent No.: US 10,516,390 B2
(45) Date of Patent: Dec. 24, 2019

(54) CIRCUIT TO MITIGATE SIGNAL DEGRADATION IN AN ISOLATION CIRCUIT

(71) Applicant: TEXAS INSTRUMENTS INCORPORATED, Dallas, TX (US)

(72) Inventors: Sankar Sadasivam, Bangalore (IN); Anbu Mani, Chennai (IN); Bryan E. Bloodworth, Coppell, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 90 days.

(21) Appl. No.: 15/395,346

(22) Filed: Dec. 30, 2016

(65) Prior Publication Data
US 2018/0191334 A1    Jul. 5, 2018

(51) Int. Cl.
*H03K 5/1252* (2006.01)
*H04L 25/02* (2006.01)
*H04L 7/00* (2006.01)

(52) U.S. Cl.
CPC ....... *H03K 5/1252* (2013.01); *H04L 25/0266* (2013.01); *H04L 7/0008* (2013.01)

(58) Field of Classification Search
CPC ............... H03K 5/1252; H03K 5/1254; H04L 25/0266; H04L 25/0268; H04L 7/0008; H04L 7/0012
USPC ........................................................ 327/156
See application file for complete search history.

(56) References Cited

U.S. PATENT DOCUMENTS

| | | | |
|---|---|---|---|
| 8,026,740 B2* | 9/2011 | Hollis | H03K 19/0002 326/59 |
| 2002/0150151 A1* | 10/2002 | Krone | H04L 25/0266 375/219 |
| 2014/0266373 A1* | 9/2014 | Goswami | H03K 3/011 327/262 |
| 2015/0332785 A1* | 11/2015 | Steensgaard-Madsen | G11C 27/024 341/122 |
| 2016/0003887 A1* | 1/2016 | Nagase | G01R 31/1263 327/546 |

* cited by examiner

*Primary Examiner* — Patrick C Chen
(74) *Attorney, Agent, or Firm* — John R. Pessetto; Charles A. Brill; Frank D. Cimino

(57) ABSTRACT

A circuit includes an isolator that provides isolated signal communications between a host-side circuit and a converter-side circuit. The isolated signal communications include a conversion start signal generated in the host-side circuit passing through the isolator to become an isolated conversion start signal in the converter-side circuit. The isolated signal communications includes an isolated system clock generated in the converter-side circuit passing through the isolator to become a system clock in the host-side circuit. A sampling clock generator in the host-side circuit generates the conversion start signal based on the system clock. A logic circuit in the converter-side circuit re-clocks the isolated conversion start signal through the logic circuit.

20 Claims, 5 Drawing Sheets

CIRCUIT TO MITIGATE SIGNAL DEGRADATION IN AN ISOLATION CIRCUIT

TECHNICAL FIELD

This disclosure relates to integrated circuits and, more particularly, to a circuit to mitigate signal degradation in an isolation circuit.

BACKGROUND

Isolated analog modules (e.g., with ADC or DAC) typically use isolators at the converter-side for galvanic isolation. The signal-to-noise ratio (SNR) of the signal chain circuit with the isolator between the converter-side circuits and host-side at high input signal frequency is degraded by jitter in the sampling clock, —due to the additive jitter of the isolator. Today's data converter system demand high speed and high resolution data capture with isolated connections to the converter. Galvanic isolation breaks ground loops which results in improved measurement accuracy and safety. Isolation can be analog isolation or digital isolation. Isolators present design challenges in isolated analog modules since the jitter degrades SNR performance of the signal chain at higher input signal frequency.

SUMMARY

This disclosure relates to a circuit to mitigate signal degradation in an isolation circuit.

In one example, a circuit includes an isolator that provides isolated signal communications between a host-side circuit and a converter-side circuit. The isolated signal communications include a conversion start signal generated in the host-side circuit passing through the isolator to become an isolated conversion start signal in the converter-side circuit. The isolated signal communications includes an isolated system clock generated in the converter-side circuit passing through the isolator to become a system clock in the host-side circuit. A sampling clock generator in the host-side circuit generates the conversion start signal based on the system clock received from the converter-side circuit. A logic circuit in the converter-side circuit clocks the isolated converter conversion start signal through the logic circuit based on the converter-side isolated system clock to provide an output signal to a converter conversion start input of a converter that mitigates jitter in the output signal.

In another example a circuit includes a host-side circuit that includes a sampling clock generator to generate a conversion start signal based on a system clock received via an isolator. A converter-side circuit includes a converter including a conversion start input, the converter configured as one of an analog to digital converter or a digital to analog converter. A logic circuit in the converter-side circuit has an output connected to provide an output signal to the conversion start input of the converter. The converter initiates a conversion in response to the output signal. A clock circuit in the converter-side circuit generates an system clock to clock the logic circuit. The system clock is provided to the host-side circuit via the isolator to define the system clock received by the sampling clock generator. The isolator provides an electrical isolation between the host-side circuit and the converter-side circuit. The isolator passes the conversion start signal from the host-side circuit through the isolator to become an isolated conversion start signal in the converter-side circuit. The logic circuit on converter-side re-clocks the isolated conversion start signal through the logic circuit to generate the output signal based on the system clock generated by the clock circuit on the converter-side.

In yet another example, a method includes generating a local clock in a converter circuit. The method includes passing the local clock through an isolation barrier to provide a corresponding system clock in a host circuit. The method includes generating a conversion start signal in the host circuit based on the corresponding system clock. The method includes passing the conversion start signal through the isolation barrier to provide a corresponding conversion start signal in the converter circuit. The method includes re-clocking the corresponding conversion start signal through a logic circuit in the converter circuit based on the local clock to provide a conversion initiation signal at an input of a converter.

DETAILED DESCRIPTION

This disclosure relates to a circuit to mitigate signal degradation in an isolation circuit, such as due to jitter. The circuit includes an isolator that separates and isolates signals (e.g., provides an isolation barrier) between a host-side circuit and a converter-side circuit that can include a converter such as an analog-to-digital (ADC) or digital-to-analog (DAC) converter, for example. A clock circuit on the converter-side circuit generates a low-jitter local clock. The local clock is passed from the converter-side circuit through the isolation barrier to provide a corresponding system clock in the host-side circuit. The host-side circuit includes a sampling clock generator that generates a conversion start signal in the host-side circuit based on the corresponding system clock. The conversion start signal is passed through the isolation barrier to provide a corresponding conversion start signal in the converter circuit, where the corresponding conversion start signal has jitter since it has been passed through the isolation barrier. The clock circuit on the converter-side re-clocks the corresponding conversion start signal through a logic circuit in the converter-side circuit based on the local low-jitter clock to provide an initiation signal at an input of the converter. Since the conversion-start signal is synchronized to the low jitter clock on the converter-side, the jitter specifications of the isolator can be relaxed which lowers circuit cost and complexities. This also eases wide bandwidth and high sampling clock system design complexities.

Figure 1:
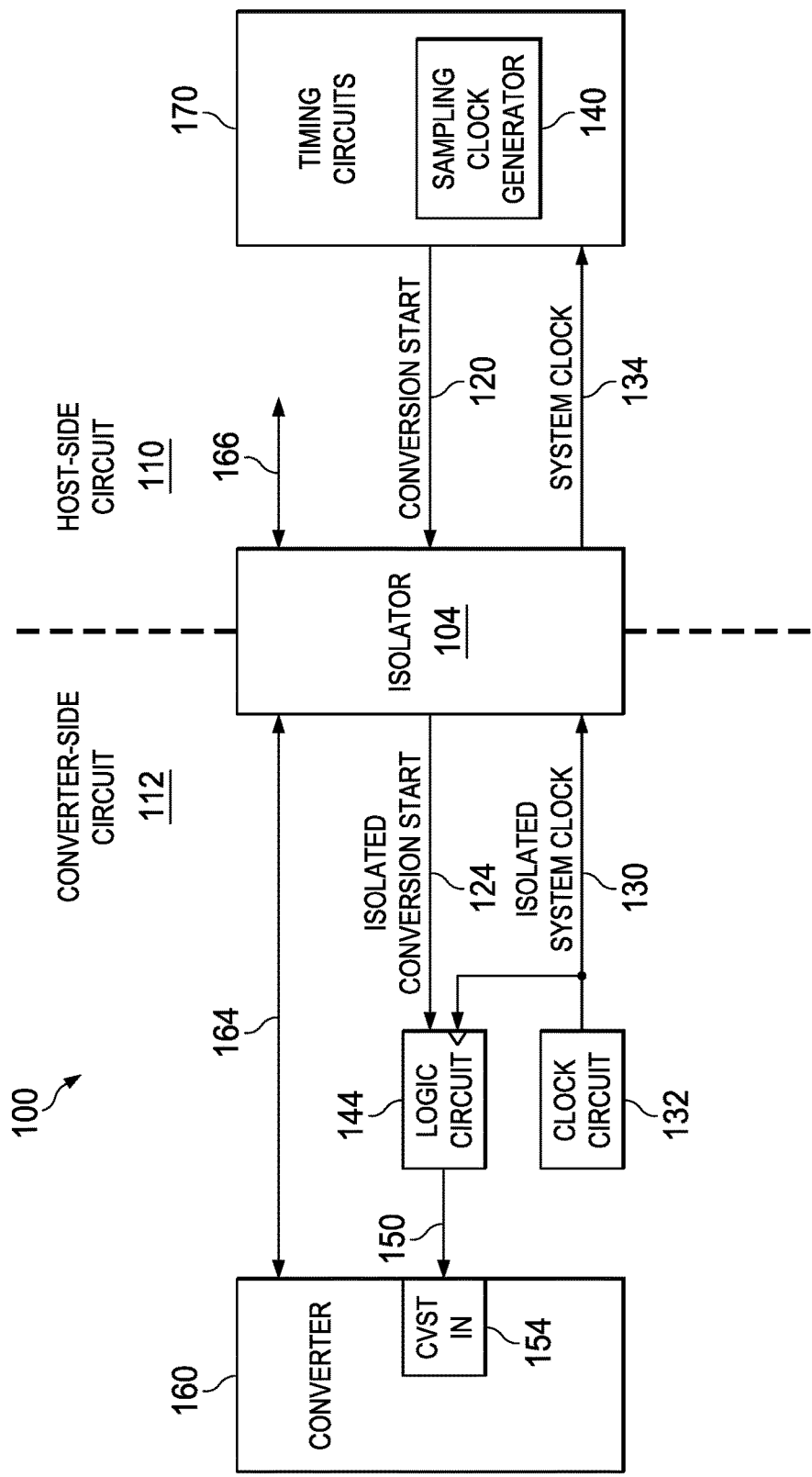
FIG. 1 illustrates a schematic block diagram of an example circuit to mitigate signal degradation in an isolation circuit.

FIG. 1 illustrates a schematic block diagram of an example circuit 100 to mitigate signal degradation in an isolation circuit such as jitter in signals that pass through the isolation. As used herein, the term circuit can include a collection of active and/or passive elements that perform a circuit function such as an analog circuit or control circuit, for example. Additionally or alternatively, the term circuit can include an integrated circuit (IC) where all and/or some of the circuit elements are fabricated on a common substrate (e.g., semiconductor substrate), for example.

In the example of FIG. 1, the circuit 100 includes an isolator 104 that provides isolation between a host-side circuit 110 and a converter-side circuit 112. As used herein, the term isolator thus refers to a circuit that provides galvanic isolation between signals of the host-side circuit 110 and the converter-side circuit 112. A capacitive isolator and an inductive isolator are examples of the isolator 104 but other examples are possible (e.g., electromagnetic or optical isolators). For purposes of consistency and clarity, signals arriving at or originating from the converter-side circuit 112 are referred to as isolated signals however, any signals passing though the isolator 104 is isolated with respect to the signal appearing on the opposite side of the isolator. As shown in FIG. 1, the isolated signal communications include a conversion start signal 120 generated in the host-side circuit 110 passing through the isolator 104 to become an isolated converter start signal 124 in the converter-side circuit 112. As used herein, the term conversion start signal refers to a sampling clock that causes a converter 160 to perform a conversion, which may be implemented as an analog-to-digital or digital-to-analog conversion. The isolated signal communications also include an isolated system clock 130 generated in the converter-side circuit 112 by a clock circuit. The isolated system clock 130 passes through the isolator 104 to become a system clock 134 in the host-side circuit 110.

A sampling clock generator 140 in the host-side circuit 110 generates the conversion start signal 120 based on the system clock 134 received via the isolator 104 from the converter-side circuit 112. A logic circuit 144 in the converter-side circuit 112 utilizes the converter-side isolated system clock 130 to clock the isolated conversion start signal 124 through the logic circuit to generate a corresponding output signal 150 that drives a conversion start input 154 of the converter 160. By utilizing the isolated system clock and the isolated conversion start signal, the logic circuit thus can provide its output signal to drive the conversion start input 154 with reduced jitter.

As shown, the converter-side circuit 112 includes the converter 160 to perform a conversion in response to the output signal 150. The converter 160 includes one or more analog-to-digital converter (ADC) and/or digital-to-analog (DAC) converter to perform the conversion, for example. A converter-side interface signal bus 164 (e.g., clock and serial data bus) can be employed to communicate conversion data to a host-side interface signal bus 166 via the isolator 104. The host-side interface signal bus 166 can further communicate with host-side controllers and processing circuits, such as disclosed herein.

The host-side circuit 110 includes a timing circuit 170 to adjust the timing of the converter start signal 120 to control set up and hold timing at the converter start input 154 of the converter 160. As will be disclosed herein (e.g., with respect to FIG. 2), the timing circuit 170 can include a delay estimator circuit to estimate a delay time for the converter start signal 120 based on measuring the transit time of a separate clock signal as it passes back and forth through the isolator 104. For instance, a clock signal can be sent across the respective busses 166 and 164 and the transit time it takes for the clock signal to travel round trip can be used for the estimate. The timing circuit 170 can also include a delay circuit to adjust timing of the converter start signal 120 based on the estimated delay time of the delay estimator circuit. Also, the timing circuit 170 can include a phased locked loop (e.g., analog or digital) to increase the frequency of the system clock 134 to increase timing accuracy when generating the converter start signal 120.

In some examples, (e.g., see FIG. 2), the host side circuit 110 can also include a formatter and a host processor where the formatter converts converter data via the bus 166 to a data format of the host processor (e.g., serial to parallel conversion, BCD to binary conversion, and so forth). The host-side circuit 110 can also include a controller to provide a serial data and timing interface from the converter 160 in the converter-side circuit 112 via bus 164 to the formatter in the host-side circuit 110 via bus 166. The clock circuit 132 can include a programmable clock (or fixed clock) to generate a programmable clock frequency for the isolated system clock on the converter-side. A separate serial bus can be provided to program the clock circuit 132 (e.g., I2C bus). The logic circuit 144 includes at least one latch (e.g., D flip flop, JK flip flop, and so forth) to clock the isolated converter start signal 124 through the logic circuit to generate the output signal 150.

Figure 2:
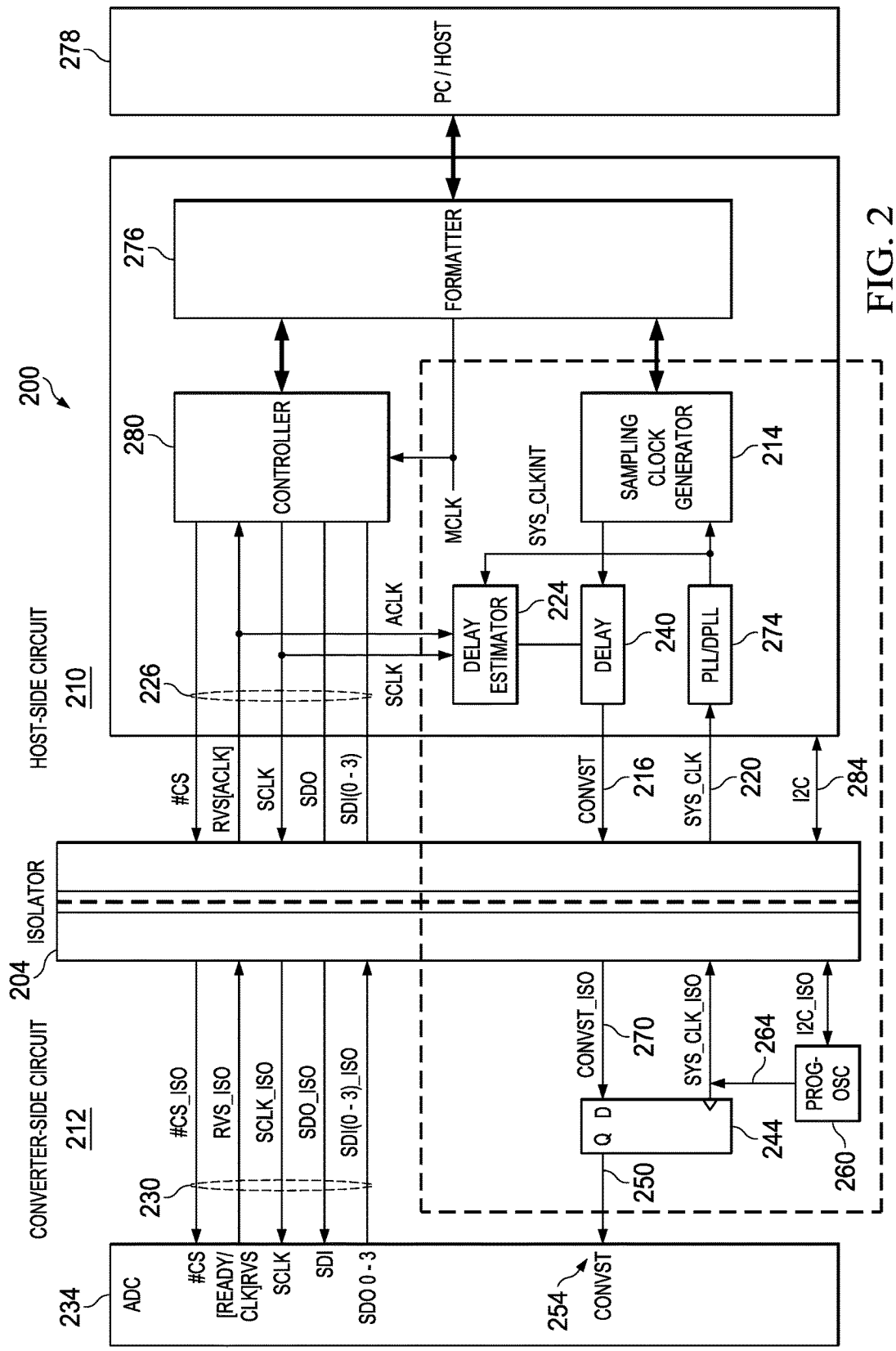
FIG. 2 illustrates an example circuit diagram to mitigate signal degradation in an isolation circuit.

FIG. 2 illustrates an example circuit 200 to mitigate signal degradation in an isolation circuit due to jitter. Similar to FIG. 1 above, the circuit 200 includes an isolator 204 that provides isolated signal communications between a host-side circuit 210 and a converter-side circuit 212. The host-side circuit 210 includes a sampling clock generator 214 to generate a converter start signal 216 based on a received system clock 220. A delay estimator circuit 224 estimates a delay time for the conversion start signal 216 based on parallel path clock measurement to the converter start signal. In this example, the delay estimator 224 can include a counter that is started when a host-side clock SCLK is generated on a host interface bus 226. After SCLK passes though the isolator 204 to a converter side bus 230, it is passed to a converter 234 (e.g., ADC) which returns a clock RCLK through the isolator 204 which stops the counter in the delay estimator 224. The time difference between SCLK and RCLK provides an estimate of the delay for the converter start signal 216. A delay circuit (e.g., digital logic or counting circuit causing a signal delay) adjusts timing of the conversion start signal 216 based on the estimated delay time of the delay estimator circuit 224 and desired setup time for the re-clocking logic circuit (244) on the converter-side. The delay adjustment mitigates the re-clocking logic (244) from going into a metastable state and also compensates for propagation delay drift due to temperature or other factors. Other signals on the respective busses 226 and 230 include chip select (CS), serial data output lines (SDO), and serial data input lines (SDI), for example.

The converter-side circuit 212 includes at least one latch 244 having a latch output to drive a conversion start input 254 of the converter 234. A programmable clock circuit 260 generates a programmable isolated system clock 264 to clock the latch 244. In applications that do not utilize fine frequency adjustment of the conversion start signal, the programmable clock circuit could be replaced with a low power, low jitter fixed frequency oscillator, for example. The isolator 204 passes the conversion start signal 216 generated in the host-side circuit 210 through the isolator to become an isolated conversion start signal 270 in the converter-side circuit 212. The isolator passes the programmable isolated system clock 264 generated in the programmable clock circuit 260 of the converter-side circuit 212 to become the system clock 220 in the host-side circuit 210. The latch 244 (or series of parallel-clocked latches) utilizes the programmable isolated system clock 264 to re-clock the isolated conversion start signal 270 through the latch to generate the latch output 250 that mitigates jitter at the conversion start input 254 of the converter 234.

The host-side circuit 210 can include a phased locked loop 274 (e.g., analog or digital) to increase the frequency of the system clock 220 to provide more timing accuracy when generating the conversion start signal 216. As noted previously, the host side circuit 210 can also include a formatter 276 and a host processor 278 where the formatter converts converter data to a data format of the host processor (e.g., serial to parallel conversion, hex to binary conversion, and so forth). The host-side circuit 210 can also include a controller 280 to provide a serial data and timing interface from the converter 234 in the converter-side circuit 212 via bus 230 to the formatter 276 in the host-side circuit 210 via bus 226. The clock circuit 260 can include a programmable clock (e.g., programmable oscillator) or fixed frequency clock to generate a programmable or fixed clock frequency for the isolated system clock 264 on the converter-side. In case of a programmable clock circuit, a separate serial bus 284 can be provided to program the clock circuit 260 (e.g., I2C bus).

Figure 3:
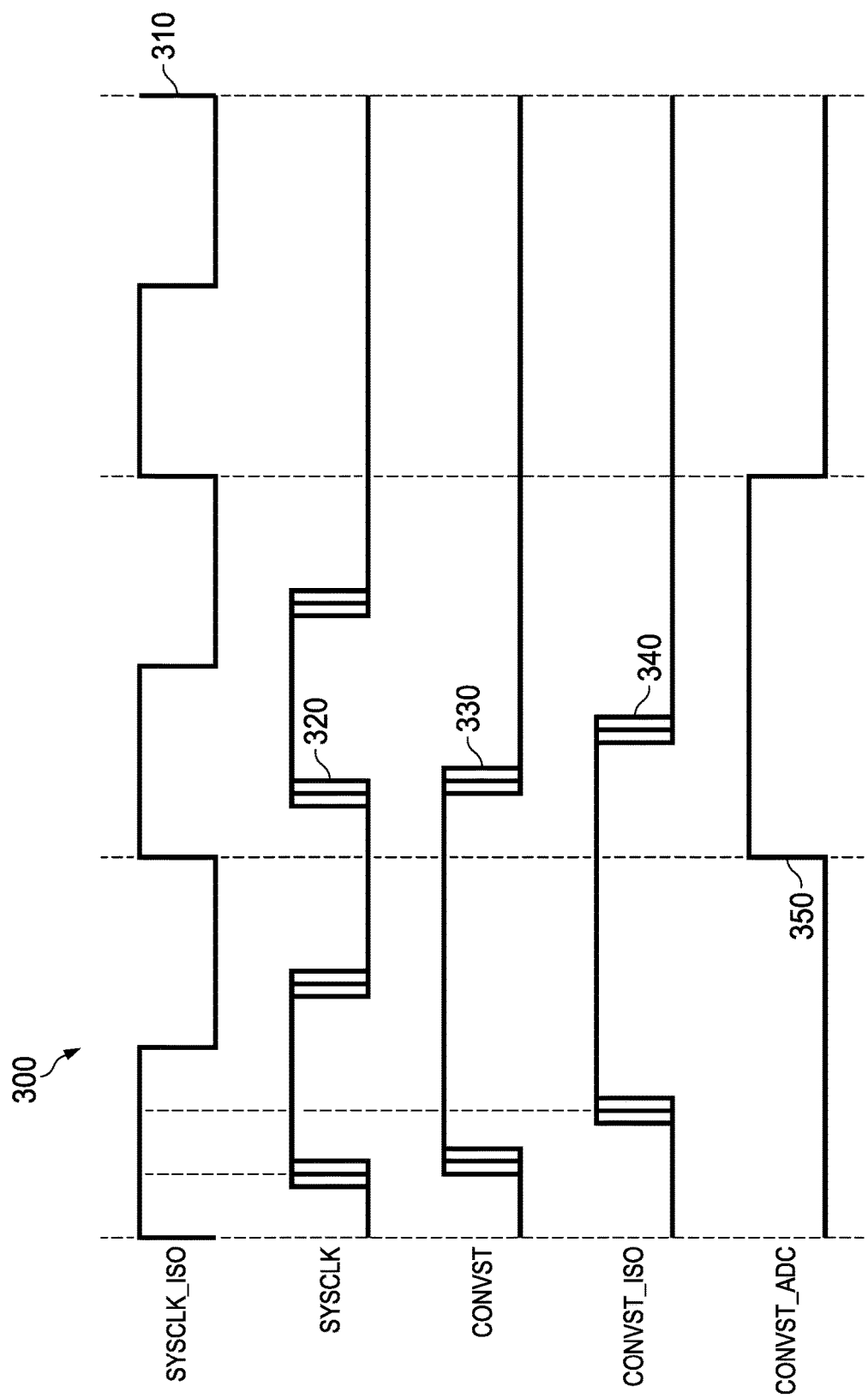
FIG. 3 illustrates an example timing diagram for a circuit to mitigate signal degradation in an isolation circuit.

FIG. 3 illustrates an example timing diagram 300 for a circuit to mitigate signal degradation in an isolation circuit due to jitter. At 310, a low-jitter isolated system clock is generated on the converter-side as previously described. After passing though the isolator, jitter appears on the system clock as shown at 320. The system clock is used to generate the converter start signal shown at 330 which also has jitter due to the jitter in the system clock at 320. The conversion start signal at 330 is passed through the isolator and becomes an isolated conversion start signal also having jitter shown at 340. After re-clocking the isolated conversion start signal through the logic/latch circuits described herein utilizing the isolated system clock at 310, a clean and substantially jitter-free conversion start signal 350 is generated which can then be applied to the conversion start input of the converter to initiate a conversion.

Figure 4:
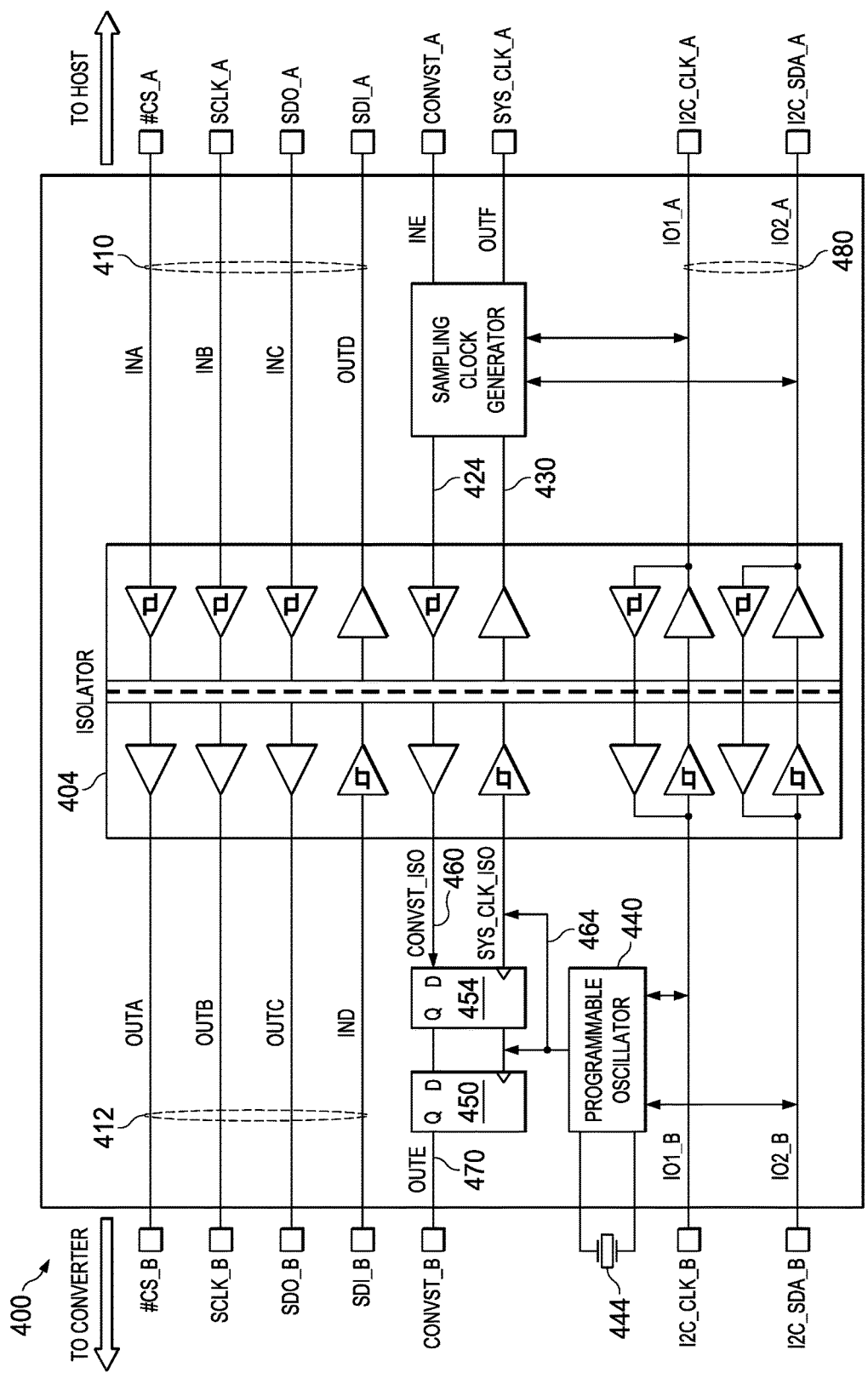
FIG. 4 illustrates an example integrated circuit diagram to mitigate signal degradation in an isolation circuit.

FIG. 4 illustrates an example integrated circuit 400 to mitigate signal degradation in an isolation circuit due to jitter. The integrated circuit 400 includes an isolator 404 that connects a host-side bus 410 to a converter-side bus 412. The circuit 400 includes a sampling clock generator 420 to generate conversion start signal 424 based on a system clock 430. The converter-side includes a programmable oscillator 440 operating as the clock circuit described herein which can be driven via an external crystal 444. Multiple latches 450 and 454 can be utilized to re-clock an isolated conversion start signal 460 having jitter through the latches based on an isolated system clock 464 from the oscillator 440 to provide a substantially jitter-free sampling clock at 470. A serial bus 480 can be provided to program the oscillator 440.

Figure 5:
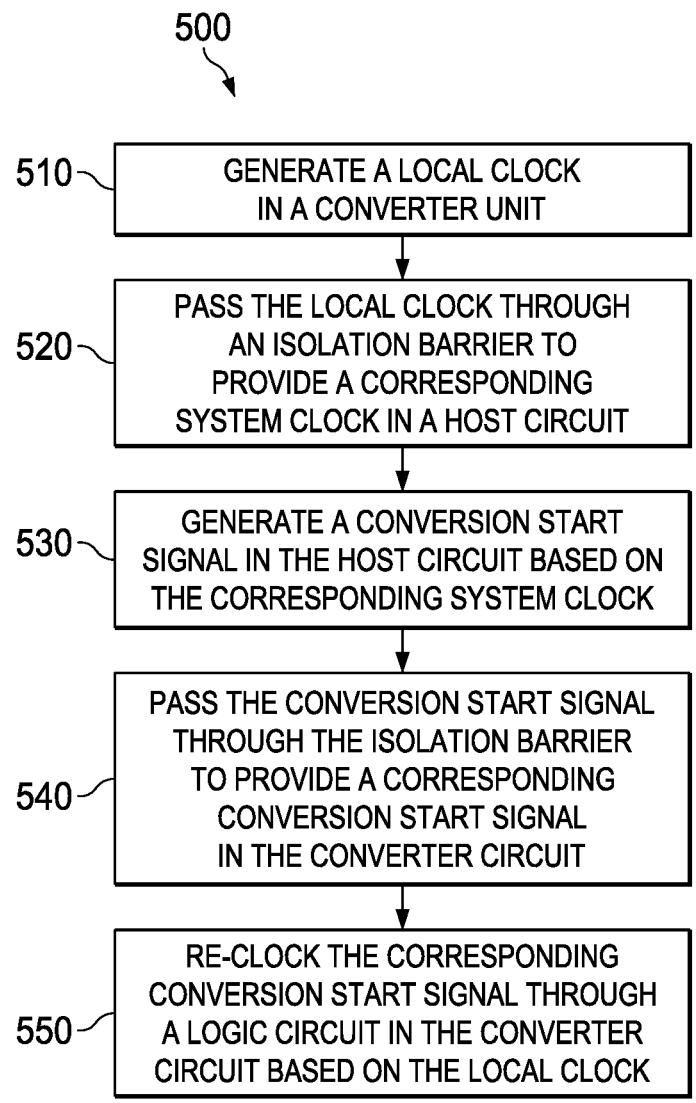
FIG. 5 illustrates an example method to mitigate signal degradation in an isolation circuit.

In view of the foregoing structural and functional features described above, an example method will be better appreciated with reference to FIG. 5. While, for purposes of simplicity of explanation, the method is shown and described as executing serially, it is to be understood and appreciated that the method is not limited by the illustrated order, as parts of the method could occur in different orders and/or concurrently from that shown and described herein. Such method can be executed by various components configured in an integrated circuit, processor, or a controller, for example.

FIG. 5 illustrates an example method 500 to mitigate signal degradation in an isolation circuit. At 510, the method 500 includes generating a local clock in a converter circuit (e.g., via clock circuit 132 of FIG. 1). At 520, the method 500 includes passing the local clock through an isolation barrier to provide a corresponding system clock in a host circuit (via isolator 104 of FIG. 1). At 530, the method 500 includes generating a conversion start signal in the host circuit based on the corresponding system clock (e.g., via sampling clock generator 140 of FIG. 1). At 540, the method 500 includes passing the conversion start signal through the isolation barrier to provide a corresponding conversion start signal in the converter circuit (e.g., via isolator 104 of FIG. 1). At 550, the method 500 includes clocking the corresponding converter start signal through a logic circuit in the converter circuit based on the local clock to provide an initiation signal at an input of a converter (e.g., via logic circuit 144 of FIG. 1). Although not show, the method 500 can also include adjusting the timing of the conversion start signal in the host circuit to control set up and hold timing of the corresponding converter start signal at the input of the converter (e.g., via timing circuits 170 of FIG. 1).

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit, comprising:
    an isolator provides isolated signal communications between a host-side circuit and a converter-side circuit, the isolated signal communications include a conversion start signal generated in the host-side circuit passing through the isolator to become an isolated conversion start signal in the converter-side circuit, the isolated signal communications includes an isolated system clock generated in the converter-side circuit passing through the isolator to become a system clock in the host-side circuit;
    a sampling clock generator, in the host-side circuit, generates the conversion start signal based on the system clock received from the converter-side circuit; and
    a logic circuit, in the converter-side circuit, clocks the isolated conversion start signal through the logic circuit based on the converter-side isolated system clock to provide an output signal to a conversion start input of a converter that mitigates jitter in the output signal.

2. The circuit of claim 1, wherein the converter includes at least one of an analog-to-digital converter (ADC) or a digital-to-analog (DAC) converter to perform a conversion in response to the output signal.

3. The circuit of claim 1, the host-side circuit further comprising a timing circuit to adjust the timing of the converter start signal to control set up and hold timing at the conversion start input of the converter.

4. The circuit of claim 3, wherein the timing circuit includes a delay estimator circuit to estimate a delay time for the conversion start signal based on measuring the transit time of a separate clock signal as it passes back and forth through the isolator.

5. The circuit of claim 4, wherein the timing circuit includes a delay circuit to adjust timing of the converter start signal based on the estimated delay time of the delay estimator circuit.

6. The circuit of claim 3, wherein the timing circuit includes a phased locked loop to increase the frequency of the system clock for timing control.

7. The circuit of claim 1, the host-side circuit further comprising an integrated circuit substrate wherein the isolator, the sampling clock generator, and the logic circuit are disposed on the substrate.

8. The circuit of claim 1, the host-side circuit further comprising a controller to provide a serial data and timing interface to enable communications between the converter in the converter-side circuit and a host processor in the host-side circuit.

9. The circuit of claim 1, further comprising a programmable or fixed clock in the converter-side circuit to generate a programmable or fixed clock frequency for the isolated system clock on the converter-side circuit.

10. The circuit of claim 1, wherein the logic circuit comprises at least one latch to clock the isolated converter start signal through the logic circuit to generate the output signal.

11. A circuit, comprising:
a host-side circuit comprising:
    a sampling clock generator to generate a converter start signal based on a system clock received via an isolator;
a converter-side circuit comprising:
    a converter including a converter start input, the converter configured as one of an analog to digital converter or a digital to analog converter;
    a logic circuit having an output connected to provide an output signal to the conversion start input of the converter, the converter initiating a conversion in response to the output signal; and
    a clock circuit to generate an isolated system clock to clock the logic circuit, the isolated system clock provided to the host-side circuit via the isolator to define the system clock received by the sampling clock generator; and
the isolator to provide an electrical isolation between the host-side circuit and the converter-side circuit, the isolator to pass the conversion start signal from the host-side circuit through the isolator to become an isolated conversion start signal in the converter-side circuit, the logic circuit re-clocking the isolated conversion start signal through the logic circuit to generate the output signal based on the isolated system clock generated by the clock circuit.

12. The circuit of claim 11, the host-side circuit further comprising a timing circuit in the host-side circuit to adjust the timing of the converter start signal to control set up and hold timing at the converter start input of the converter.

13. The circuit of claim 12, wherein the timing circuit includes a delay estimator circuit to estimate a delay time for the converter start signal based on measuring the transit time of a separate clock signal as it passes back and forth through the isolator.

14. The circuit of claim 13, wherein the timing circuit includes a delay circuit to adjust timing of the converter start signal based on the estimated delay time of the delay estimator circuit.

15. The circuit of claim 12, wherein the timing circuit includes a phased locked loop to increase the frequency of the system clock for timing control.

16. The circuit of claim 11, the host-side circuit further comprising an integrated circuit substrate wherein at least the isolator, the sampling clock generator, and the logic circuit are disposed on the substrate.

17. The circuit of claim 11, the host-side circuit further comprising a controller to provide a serial data and timing interface to enable communications between the converter in the converter-side circuit and a host processor in the host-side circuit.

18. The circuit of claim 11, further comprising a programmable clock in the converter-side circuit to generate a fixed or programmable clock frequency for the isolated system clock on the converter-side circuit.

19. A method, comprising:
generating a local clock in a converter circuit;
passing the local clock through an isolation barrier to provide a corresponding system clock in a host circuit;
generating a conversion start signal in the host circuit based on the corresponding system clock;
passing the conversion start signal through the isolation barrier to provide a corresponding conversion start signal in the converter circuit; and
re-clocking the corresponding conversion start signal through a logic circuit in the converter circuit based on the local clock to provide an initiation signal at an input of a converter.

20. The method of claim 19, further comprising adjusting the timing of the conversion start signal in the host circuit to control set up and hold timing of the corresponding conversion start signal at the input of the converter.

* * * * *